(12) United States Patent
Avila et al.

(10) Patent No.: US 9,013,919 B2
(45) Date of Patent: *Apr. 21, 2015

(54) DATA RANDOMIZATION IN 3-D MEMORY

(71) Applicant: SanDisk Technologies Inc., Plano, TX (US)

(72) Inventors: Chris Avila, Saratoga, CA (US); Yingda Dong, San Jose, CA (US); Lee Gavens, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/279,017

(22) Filed: May 15, 2014

(65) Prior Publication Data

US 2014/0250266 A1   Sep. 4, 2014

Related U.S. Application Data

(63) Continuation of application No. 13/754,137, filed on Jan. 30, 2013.

(51) Int. Cl.
*G11C 11/34* (2006.01)
*G06F 3/06* (2006.01)
*G06F 12/02* (2006.01)
*G11C 16/00* (2006.01)

(52) U.S. Cl.
CPC ............ *G06F 3/064* (2013.01); *G06F 12/0246* (2013.01); *G06F 3/0604* (2013.01); *G06F 3/0688* (2013.01); *G06F 2003/0695* (2013.01); *G11C 16/00* (2013.01)

(58) Field of Classification Search
USPC ............ 365/185.02, 185.03, 185.11, 185.12, 365/185.17, 185.18, 185.24, 185.29, 185.33
See application file for complete search history.

(56) References Cited

U.S. PATENT DOCUMENTS

| | | | |
|---|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |

(Continued)

FOREIGN PATENT DOCUMENTS

| | | |
|---|---|---|
| WO | WO 2009088920 | 7/2009 |
| WO | WO 2010030701 | 3/2010 |

(Continued)

OTHER PUBLICATIONS

U.S. Appl. No. 13/791,200 entitled "Optimized Configurable NAND Parameters," filed Mar. 8, 2013, 37 pages.

(Continued)

*Primary Examiner* — Trong Phan
(74) *Attorney, Agent, or Firm* — Davis Wright Tremaine LLP

(57) ABSTRACT

In a nonvolatile memory array, such as a three-dimensional array of charge-storage memory cells, data is randomized so that data of different strings along the same bit line are randomized using different keys and portions of data along neighboring word lines are randomized using different keys. Keys may be rotated so that data of a particular word line is randomized according to different keys in different strings.

21 Claims, 14 Drawing Sheets

(56) References Cited

U.S. PATENT DOCUMENTS

| | | | |
|---|---|---|---|
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,518,919 | B2 | 4/2009 | Gonzalez et al. |
| 7,839,685 | B2 | 11/2010 | Auclair et al. |
| 8,301,912 | B2 | 10/2012 | Lin et al. |
| 8,451,658 | B2 * | 5/2013 | Sharon et al. ............ 365/185.02 |
| 8,472,257 | B2 | 6/2013 | Dong et al. |
| 8,913,427 | B2 | 12/2014 | Huh |
| 2005/0122779 | A1 | 6/2005 | Fasoli et al. |
| 2007/0263439 | A1 | 11/2007 | Cornwell et al. |
| 2008/0115541 | A1 | 5/2008 | Aldridge |
| 2008/0288814 | A1 | 11/2008 | Kitahara |
| 2008/0294949 | A1 | 11/2008 | Sugahara |
| 2009/0168533 | A1 | 7/2009 | Park et al. |
| 2009/0204824 | A1 | 8/2009 | Lin et al. |
| 2009/0268524 | A1 | 10/2009 | Maejima |
| 2009/0323942 | A1 | 12/2009 | Sharon et al. |
| 2010/0070682 | A1 | 3/2010 | Wan et al. |
| 2010/0241874 | A1 | 9/2010 | Vergnes et al. |
| 2010/0322000 | A1 | 12/2010 | Shim et al. |
| 2011/0032759 | A1 | 2/2011 | Kim et al. |
| 2011/0038203 | A1 | 2/2011 | Camp et al. |
| 2011/0119431 | A1 | 5/2011 | Chowdhury |
| 2011/0161784 | A1 | 6/2011 | Selinger et al. |
| 2012/0051137 | A1 | 3/2012 | Hung et al. |
| 2012/0166708 | A1 | 6/2012 | Chung et al. |
| 2012/0166714 | A1 | 6/2012 | Mun et al. |
| 2012/0220088 | A1 | 8/2012 | Alsmeier |
| 2012/0239861 | A1 | 9/2012 | Lee et al. |
| 2012/0272017 | A1 | 10/2012 | Lee et al. |
| 2012/0275240 | A1 | 11/2012 | Choi |
| 2012/0284589 | A1 | 11/2012 | Kim et al. |
| 2012/0297111 | A1 | 11/2012 | Hsu et al. |
| 2013/0083619 | A1 | 4/2013 | Jeon et al. |
| 2013/0107628 | A1 | 5/2013 | Dong et al. |
| 2013/0201760 | A1 | 8/2013 | Dong et al. |

FOREIGN PATENT DOCUMENTS

| | | |
|---|---|---|
| WO | WO 2011019600 | 2/2011 |
| WO | WO 2011019602 | 2/2011 |
| WO | WO 2012023102 | 2/2012 |

OTHER PUBLICATIONS

U.S. Appl. No. 61/731,198, filed Nov. 29, 2012, 32 pages.
U.S. Appl. No. 61/731,215, filed Nov. 29, 2012, 42 pages.
U.S. Appl. No. 14/064,823, filed Oct. 28, 2013, 48 pages.
U.S. Appl. No. 14/064,887, filed Oct. 28, 2013, 42 pages.
U.S. Appl. No. 13/908,905, filed Jun. 13, 2013, 48 pages.
U.S. Appl. No. 13/940,504 entitled Efficient Smart Verify Method for Programming 3D Non-Volatile Memory, filed Jun. 12, 2013, 49 pages.
U.S. Appl. No. 14/025,160 entitled "Vread Bias Allocation on Word Lines for Read Disturb Reduction in 3D Non-Volatile Memory," filed Sep. 12, 2013, 54 pages.
U.S. Appl. No. 13/801,741 entitled "Weighted Read Scrub for Non-volatile Memory," filed Mar. 3, 2013, 45 pages.
Eitan et al., "NROM: A Novel Localized Trapping, 2-Bit Nonvolatile Memory Cell," IEEE Electron Device Letters, vol. 21, No. 11, Nov. 2000, pp. 543-545.
Technical Search Report, Dec. 12, 2012, 10 pages.
Office Action for U.S. Appl. No. 13/754,137 mailed Sep. 17, 2014, 21 pages.
Final Office Action for U.S. Appl. No. 13/754,137 mailed Dec. 31, 2014, 14 pages.

* cited by examiner

Programming into four states represented by a 2-bit code

FIG. 12

| WL | Lower | Upper |
|----|-------|-------|
| 0  | 7     | 6     |
| 1  | 28    | 11    |
| 2  | 5     | 17    |
| 3  | 10    | 25    |
| 4  | 21    | 13    |
| 5  | 23    | 4     |
| 6  | 16    | 1     |
| 7  | 0     | 27    |
| 8  | 29    | 20    |
| 9  | 12    | 8     |
| 10 | 18    | 14    |
| 11 | 24    | 3     |
| 12 | 19    | 30    |
| 13 | 2     | 22    |
| 14 | 9     | 15    |
| 15 | 26    | 31    |

| WL | Lower | Upper |
|----|-------|-------|
| 16 | 7     | 6     |
| 17 | 28    | 11    |
| 18 | 5     | 17    |
| 19 | 10    | 25    |
| 20 | 21    | 13    |
| 21 | 23    | 4     |
| 22 | 16    | 1     |
| 23 | 0     | 27    |
| 24 | 29    | 20    |
| 25 | 12    | 8     |
| 26 | 18    | 14    |
| 27 | 24    | 3     |
| 28 | 19    | 30    |
| 29 | 2     | 22    |
| 30 | 9     | 15    |
| 31 | 26    | 31    |

FIG. 13

| WL | Lower | Upper |
|----|-------|-------|
| 0  | 7     | 6     |
| 1  | 28    | 11    |
| 2  | 5     | 17    |
| 3  | 10    | 25    |
| 4  | 21    | 13    |
| 5  | 23    | 4     |
| 6  | 16    | 1     |
| 7  | 0     | 27    |
| 8  | 29    | 20    |
| 9  | 12    | 8     |
| 10 | 18    | 14    |
| 11 | 24    | 3     |
| 12 | 19    | 30    |
| 13 | 2     | 22    |
| 14 | 9     | 15    |
| 15 | 26    | 7     |

| WL | Lower | Upper |
|----|-------|-------|
| 16 | 6     | 28    |
| 17 | 11    | 5     |
| 18 | 17    | 10    |
| 19 | 25    | 21    |
| 20 | 13    | 23    |
| 21 | 4     | 16    |
| 22 | 1     | 0     |
| 23 | 27    | 29    |
| 24 | 20    | 12    |
| 25 | 8     | 18    |
| 26 | 14    | 24    |
| 27 | 3     | 19    |
| 28 | 30    | 2     |
| 29 | 22    | 9     |
| 30 | 15    | 26    |
| 31 | 7     | 6     |

FIG. 14

| WL | Lower | Upper |
|----|-------|-------|
| 0  | 7     | 6     |
| 1  | 28    | 11    |
| 2  | 5     | 17    |
| 3  | 10    | 25    |
| 4  | 21    | 13    |
| 5  | 23    | 4     |
| 6  | 16    | 1     |
| 7  | 0     | 27    |
| 8  | 29    | 20    |
| 9  | 12    | 8     |
| 10 | 18    | 14    |
| 11 | 24    | 3     |
| 12 | 19    | 30    |
| 13 | 2     | 22    |
| 14 | 9     | 15    |
| 15 | 26    | 31    |

| WL | Lower | Upper |
|----|-------|-------|
| 16 | 6     | 28    |
| 17 | 11    | 5     |
| 18 | 17    | 10    |
| 19 | 25    | 21    |
| 20 | 13    | 23    |
| 21 | 4     | 16    |
| 22 | 1     | 0     |
| 23 | 27    | 29    |
| 24 | 20    | 12    |
| 25 | 8     | 18    |
| 26 | 14    | 24    |
| 27 | 3     | 19    |
| 28 | 30    | 2     |
| 29 | 22    | 9     |
| 30 | 15    | 26    |
| 31 | 31    | 7     |

| Key | | | | |
|-----|----|----|----|----|
| 1   | C7 | 34 | C6 | 69 |
| 2   | 8E | 69 | 8C | D3 |
| 3   | 1C | D3 | 19 | A7 |
| 4   | 39 | A6 | 33 | 4E |
| 5   | 73 | 4C | 66 | 9C |
| 6   | E6 | 98 | CD | 38 |

| Inverted Key | | | | |
|------|----|----|----|----|
| /1   | 38 | CB | 39 | 96 |
| /2   | 71 | 96 | 73 | 2C |
| /3   | E3 | 2C | E6 | 58 |
| /4   | C6 | 59 | CC | B1 |
| /5   | 8C | B3 | 99 | 63 |
| /6   | 19 | 67 | 32 | C7 |

DATA RANDOMIZATION IN 3-D MEMORY

CROSS-REFERENCED APPLICATIONS

This application is a continuation of U.S. application Ser. No. 13/754,137 filed Jan. 30, 2013, which application is hereby incorporated by reference in its entirety.

BACKGROUND

This application relates to the operation of re-programmable non-volatile memory systems such as semiconductor flash memory which record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

Examples of the present invention relate to schemes and circuits for randomizing data for storage in 3-D memory arrays. Certain data patterns may cause damage to data and randomization may be used to reduce the probability of such patterns occurring. In 3-D memory, a variety of patterns may cause damage. These may include patterns that are also damaging in 2-D memory, and may additionally include damaging patterns that are specific to 3-D memory, or to particular 3-D memory designs. Randomization may be performed in a memory controller, in a memory chip, or elsewhere.

An example of a method of operating a three-dimensional charge-storage memory that stores data in strings of vertically-stacked memory cells includes: receiving a plurality of portions of data to be stored in the three-dimensional charge-storage memory array; determining physical locations in the three-dimensional charge-storage memory array for storing the plurality of portions of data; and randomizing the plurality of portions of data according to their respective physical locations using a plurality of randomization keys such that portions of data in immediately adjacent physical locations in the vertical and horizontal directions are randomized using different randomization keys.

The plurality of randomization keys may be used in a sequence, with fewer than all available randomization keys used in an iteration of the sequence. The plurality of randomization keys may be used in a sequence, with iterations of the sequence starting with different randomization keys. Selected portions of the plurality of portions of data may be inverted. Selected randomization keys of the plurality of randomization keys may be inverted prior to performing randomization. The vertically-stacked memory cells may form U-shaped strings with corresponding word lines of different strings of a block connected together, data may be randomized along an individual word line using randomization that is different to randomization used for any corresponding word line connected to the individual word line.

An example of a method of operating a three-dimensional charge-storage memory in which word lines of different strings within a block are connected together includes: receiving a plurality of portions of data to be stored in the three-dimensional charge-storage memory array; determining physical locations in the three-dimensional charge-storage memory array for storing the plurality of portions of data, the physical locations including a plurality of locations along commonly connected word lines in a block; and randomizing the plurality of portions of data according to their respective physical locations using a plurality of randomization keys such that portions of data to be stored along commonly connected word lines are randomized using different randomization.

Portions of data to be stored along commonly connected word lines may be randomized by applying randomization keys according to a predetermined sequence. Randomization may be modified by omitting one or more randomization keys from the predetermined sequence in different iterations. Randomization may be modified by applying an offset within the predetermined sequence so that different starting randomization keys are used in different iterations. At least some different randomization keys may be generated by inverting other randomization keys.

An example of a three-dimensional charge-storage memory system includes: a plurality of strings of memory cells connected in series in the vertical direction, with word-lines of different strings of a block connected together; and a randomization circuit that randomizes portions of data, prior to storage in the plurality of strings of memory cells, using a plurality of randomization keys, such that portions of data stored in immediately adjacent physical locations in the vertical and horizontal directions are randomized using different randomization.

The randomization circuit may use the plurality of randomization keys according to a sequence. The randomization circuit may omit one or more of the plurality of randomization keys in an iteration of the sequence. The randomization circuit may apply a variable offset within the sequence to determine a first randomization key of an iteration of the sequence. The randomization circuit may be on a first chip and the plurality of strings of memory cells may be on a second chip. There may be an on-chip scrambler circuit on the second chip. Some data to be stored in the plurality of strings of memory cells may be randomized using the randomization circuit on the first chip and some of the data to be stored in the plurality of strings of memory cells may be randomized using the on-chip scrambler circuit on the second chip. Data to be stored in the plurality of strings of memory cells may be randomized using the randomization circuit on the first chip and may be additionally randomized using the on-chip scrambler circuit on the second chip.

An example of a three-dimensional charge-storage memory array includes: a plurality of strings of memory cells connected in series in the vertical direction, with word-lines of different strings of a block connected together; and a randomization circuit that randomizes portions of data, prior to storage in the plurality of strings of memory cells, using a plurality of randomization keys, such that data to be stored along commonly connected word lines are randomized using different randomization.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 12 shows a repeated pattern of randomization keys.

FIG. 13 shows a pattern of randomization keys that is misaligned with physical data storage.

FIG. 14 shows another pattern of randomization keys that is misaligned with physical data storage.

FIG. 15A shows a pattern of writing data to word lines of a memory array.

FIG. 15B shows a pattern of randomization keys applied to word lines.

FIG. 16 shows an example of inverting randomization keys.

DETAILED DESCRIPTION

Memory System

Figure 1:
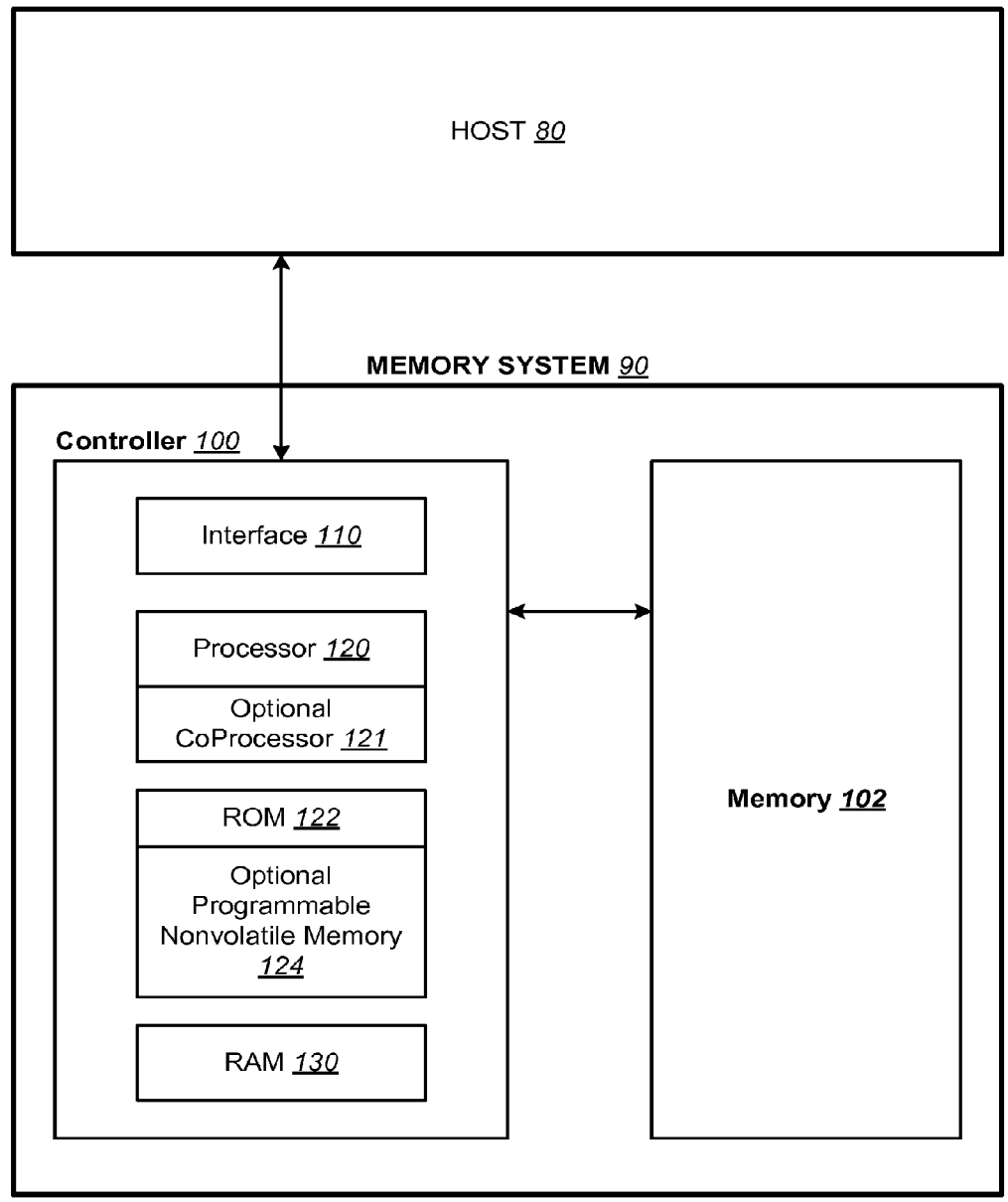
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
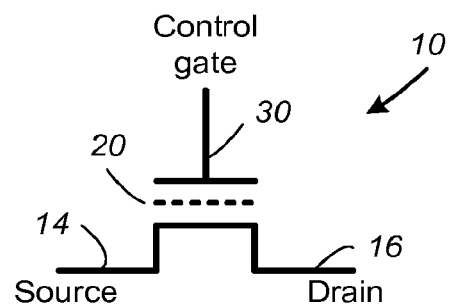
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
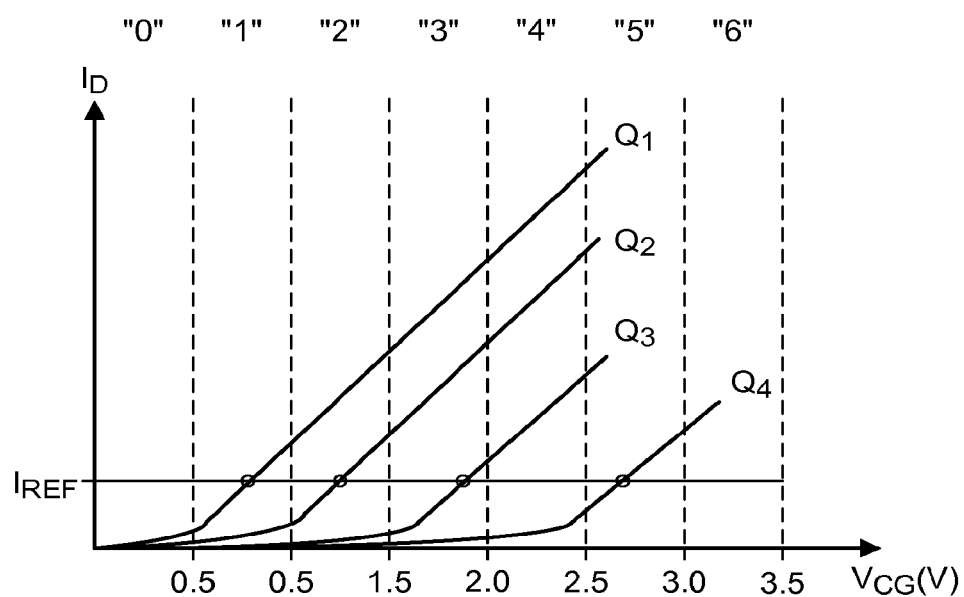
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven programmed memory states "0", "1", "2", "3", "4", "5", "6", respectively and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
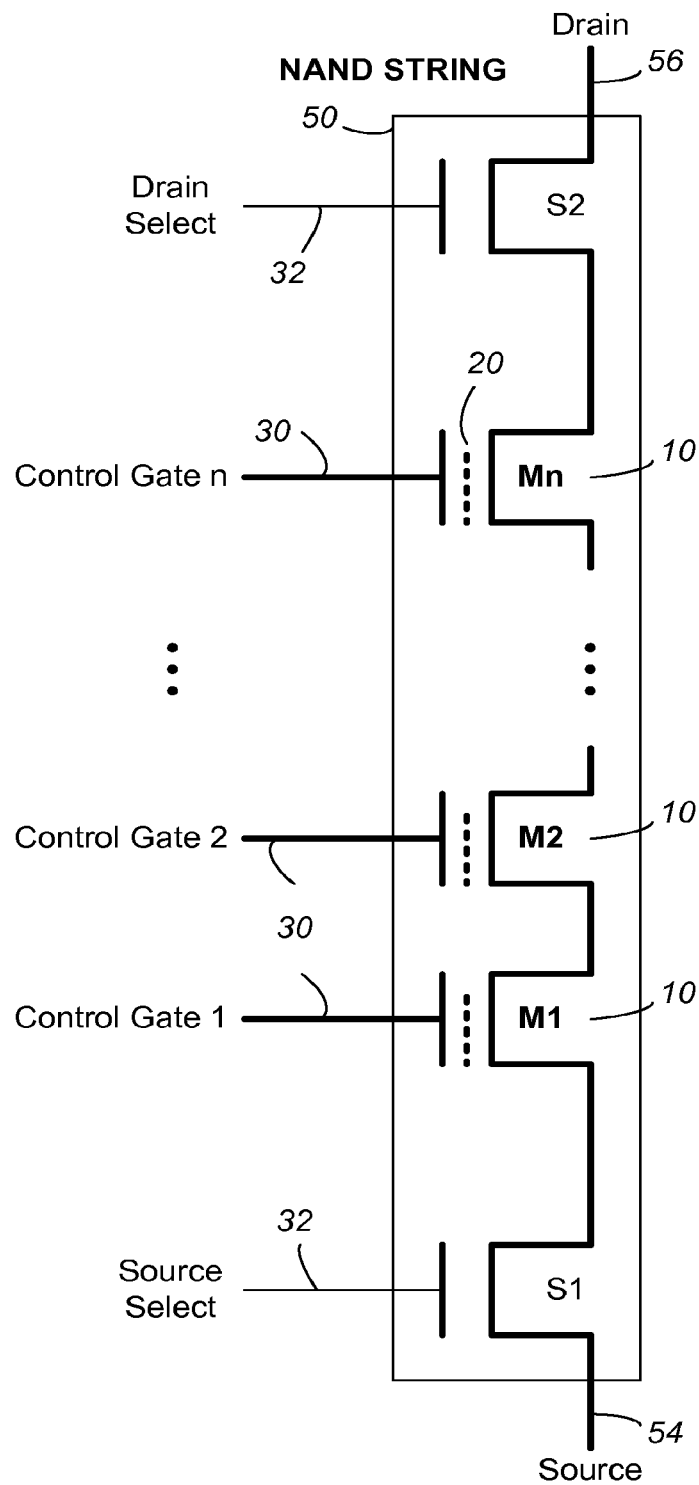
FIG. 4A illustrates schematically a string of memory cells organized into a NAND string.

FIG. 4A illustrates schematically a string of memory cells organized into a NAND string. A NAND string 50 comprises of a series of memory transistors M1, M2, ... Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
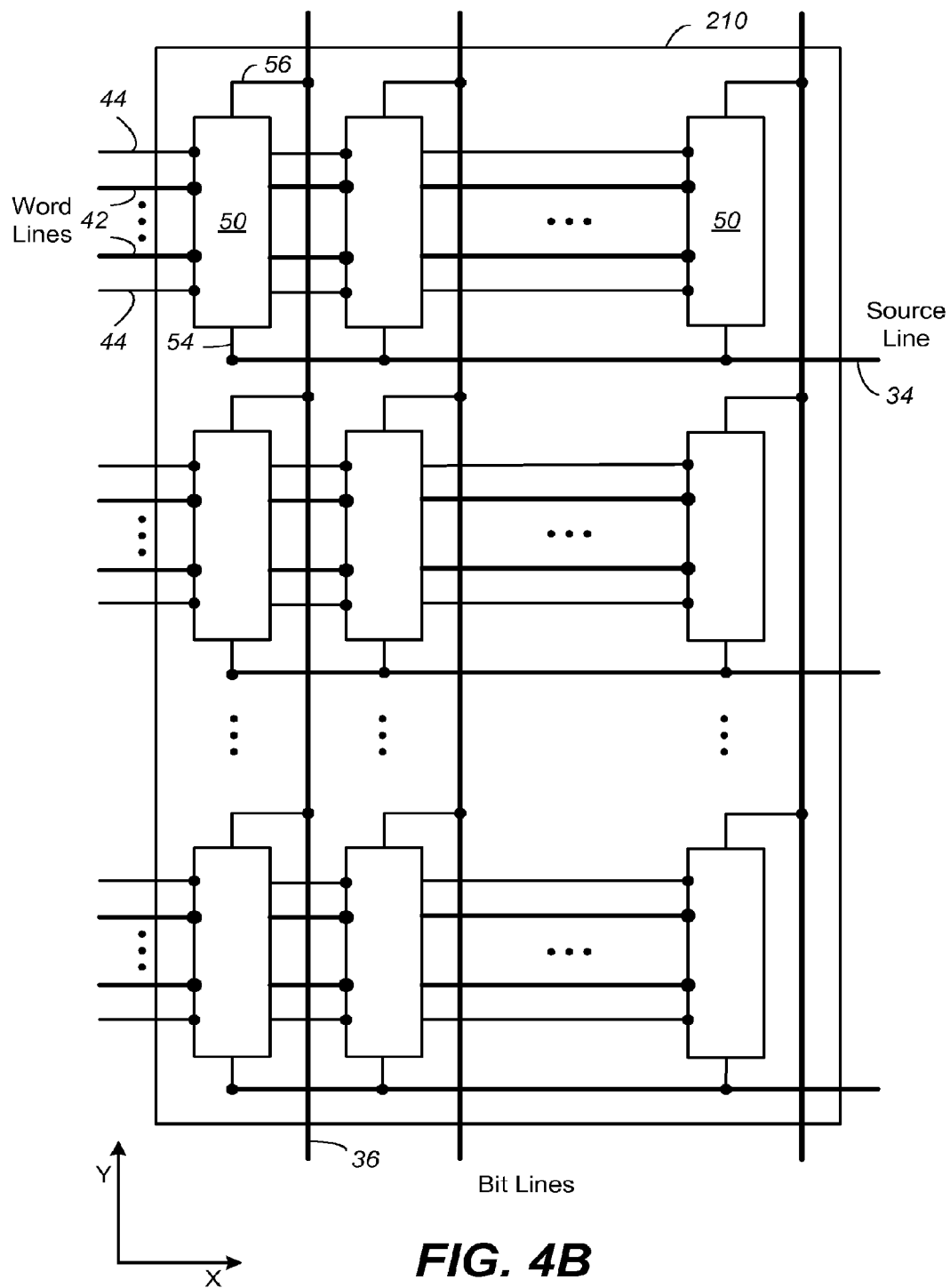
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
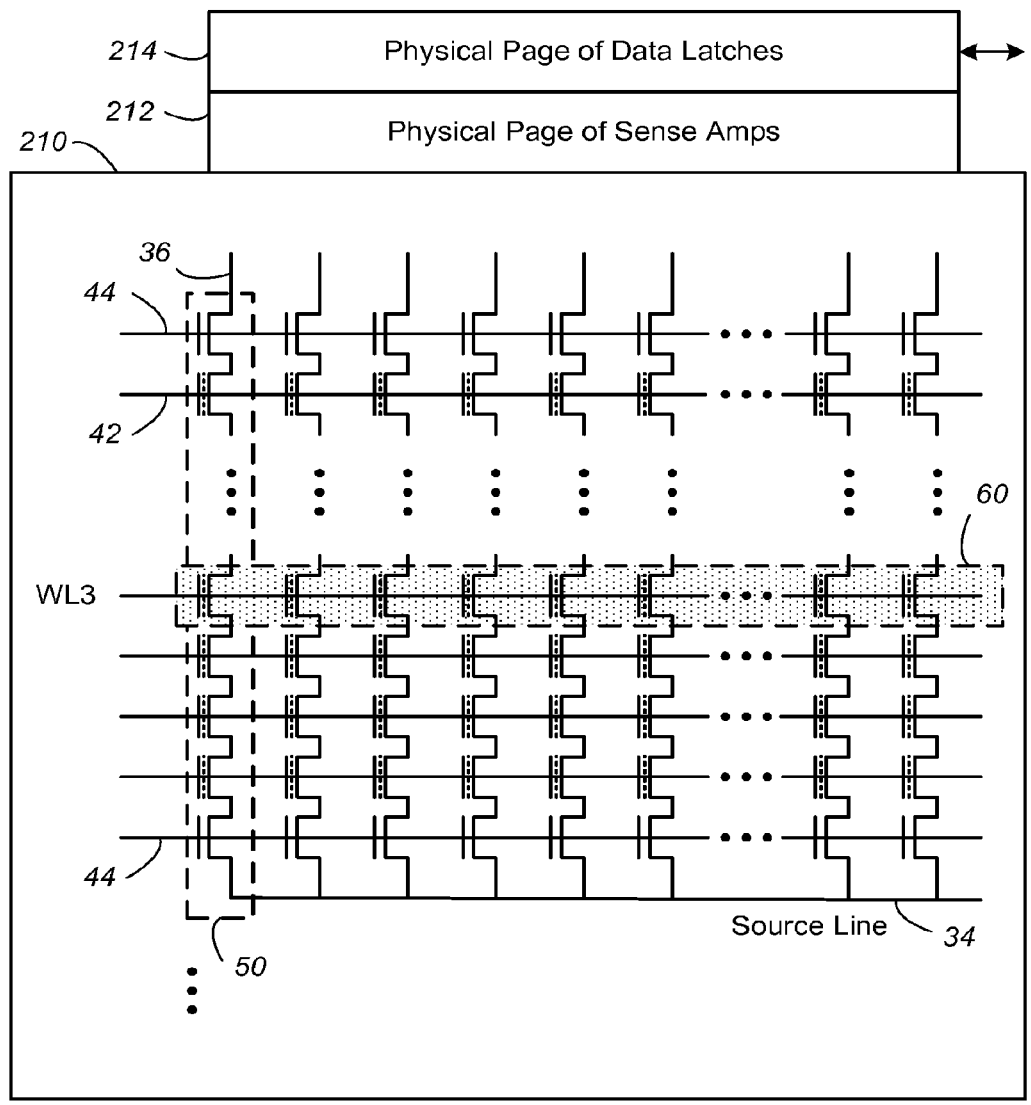
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6A:
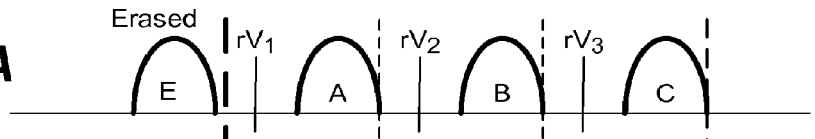
FIGS. 6A-6C illustrate an example of programming a population of 4-state memory cells.
Figure 6B:
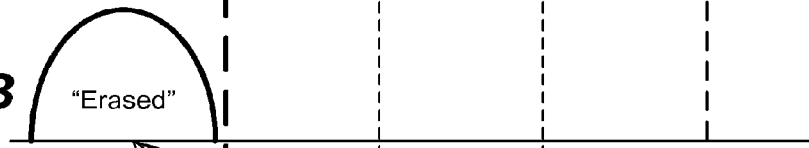
Figure 6C:
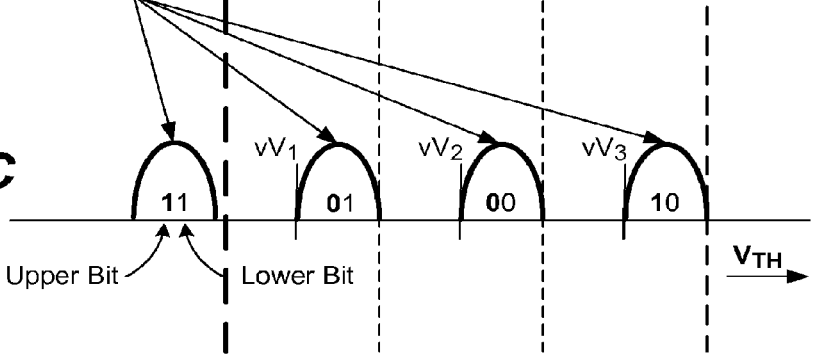

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Data Randomization

Data that is stored using charge storage may be randomized or scrambled in some way for a number of reasons (the terms "randomize" and "scramble" may be considered synonymous for purposes of the present application, similarly "randomizer" and "scrambler" may be considered synonymous). For example, data randomization may be used as a way to avoid particular patterns of programming memory cells that could lead to an increased risk of data disturbance. It has been found that certain patterns, such as groups of cells programmed with higher charge (e.g. programmed to highest state) may affect threshold voltages of adjacent cells and thus cause data to be misread.

Figure 7A:
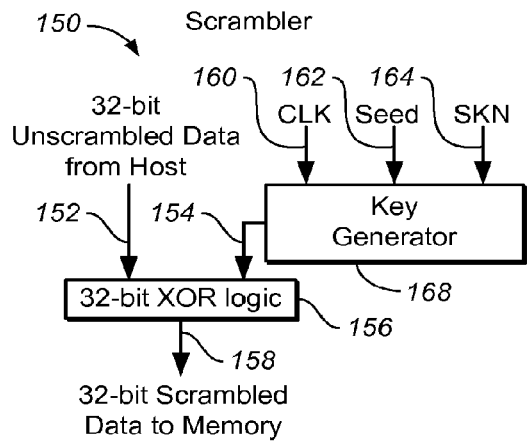
FIG. 7A shows an example of a scrambler circuit.
Figure 7B:
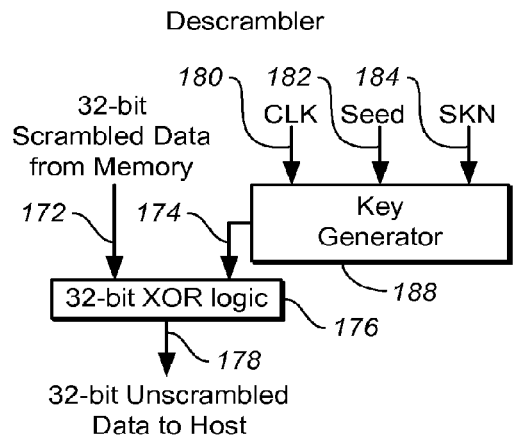
FIG. 7B shows an example of a descrambler circuit.

U.S. Patent Publication No. 2012/0297111 and U.S. Pat. No. 8,301,912, ("the '912 patent"), describe examples of systems and methods for providing scrambling. FIGS. 7A and 7B of the present application (corresponding to FIGS. 3A and 3B respectively of the '912 patent) show a scrambler and descrambler, and FIGS. 8A and 8B (corresponding to FIGS. 4 and 6 of the '912 patent) illustrate rotating keys, that may be used in embodiments of the present invention as described in the '912 patent below.

Such a Scrambler is based on a simple encryption method using exclusive-OR (XOR) logic and a known key. The simple XOR logic provides for scrambling data using the key, and then descrambling to get the original data back using the same key. In FIG. 7A, unscrambled data from a host is conveyed on bus 152 to an XOR block 156. In addition, a scrambling key is conveyed on bus 154 to the XOR block 156, which then performs a bit-wise XOR operation to generate the scrambled data conveyed on bus 158. The key generator 168 receives a clock signal 160, a seed key on bus 162, and a starting key number SKN on bus 164 (explained below), from which it generates the scrambling key on bus 154.

In FIG. 7B, scrambled data from memory is conveyed on bus 172 to an XOR block 176. The scrambling key is conveyed on bus 174 to the XOR block 176, which then performs a bit-wise XOR operation to generate the unscrambled data conveyed on bus 178. As before, the key generator 188 receives a clock signal 180, a seed key on bus 182, and a starting key number SKN on bus 184, from which it generates the descrambling key on bus 174. Even though shown as separate blocks, the XOR block and Key generator block may be shared and used for both scrambling and descrambling, with appropriate steering of the various input and output busses. Bit-wise XOR operation between Host data and Scrambler Keys enables simple descrambling with the known Seed and Key number used to scramble.

Figure 8A:
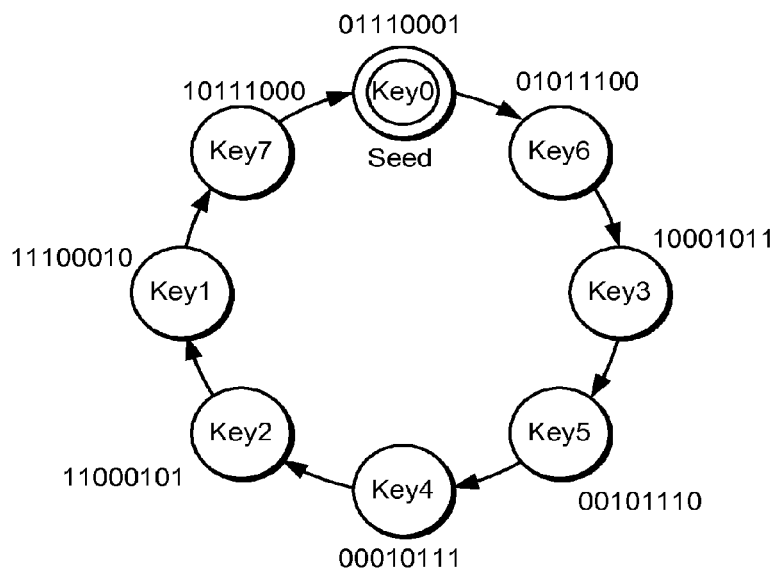
FIG. 8A shows rotation of 8-bit keys.
Figure 8B:
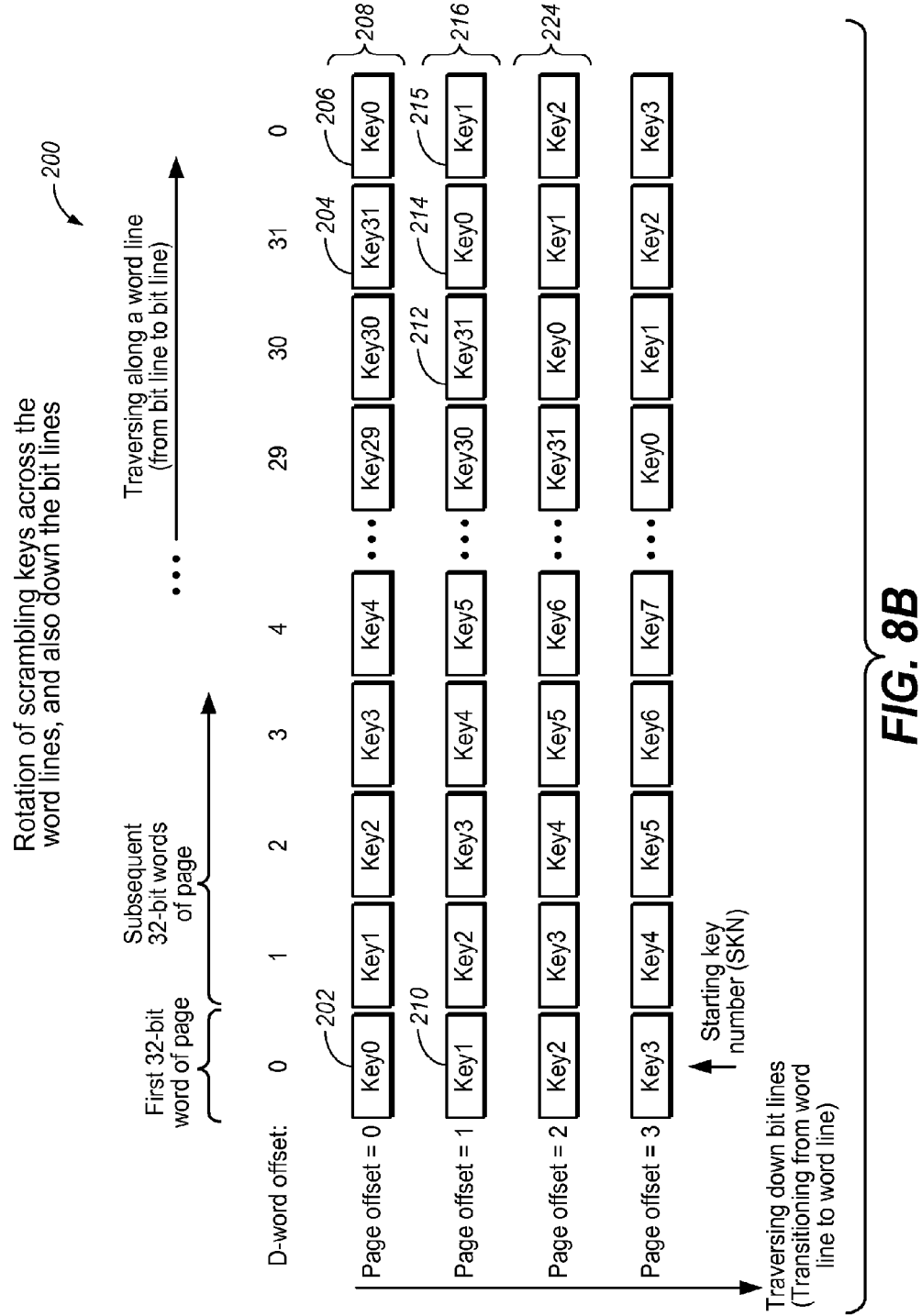
FIG. 8B shows rotation of scrambling keys across word lines.

A set of bit strings can be easily generated by rotating an initial bit string, referred to as the Seed, one bit at a time until the pattern of bits starts repeating. This can be accomplished by employing a fixed length shift register to create a sequence of rotating Keys with the Key values being controlled by the initial Seed value. For example, an 8-bit shift register can produce up to 8 unique Keys. An exemplary set of rotating 8-bit keys (left direction) are shown in FIG. 8A. In this example, Key0 is followed by Key1, which is followed by Key2, etc. Of course, an initial bit string alternatively could be rotated to the right to generate a sequence of rotating keys. In some embodiments, a serial shifter may be used, while in other embodiments other shifters, such as a barrel shifter, may be used.

Thus, in certain embodiments, the Scrambler Key may be generated from an initial Seed Key which may be rotated one bit at a time to create successive Scrambler Keys. The Seed preferably is a minimum of 32 bits long (although any other length may also be used), and preferably has a predetermined hardware default value, which firmware (FW) may change during initialization (as further described below). Every 32 bits of data are XOR'ed with a Scrambler Key, after which the next Key is automatically generated (e.g., by left-rotating the current Key to create the next Key) to be used with the next 32 bits of data. Only the Seed, which is the initial Key, needs to be set by the FW because subsequent Keys are automatically generated for each new cycle (e.g., by toggling the CLK signal shown in FIGS. 7A and 7B).

The Keys are logically XOR'ed with chunks of data (e.g., 32 bits of data), thus the number of 1's and 0's in the Keys causes data bits to toggle, which directly translates to memory cell states being scrambled across the word-lines. After 128 bytes (32 Keys*32 bits/8 bits/byte) from the beginning of the memory page, the key number will wrap around and the scrambling pattern will repeat itself. This is visually depicted in FIG. 8B, which shows several memory pages 208, 216, 224, etc. of a memory block 200. The first 32-bit word (labeled 202) of the first memory page 208 is scrambled using Key0. As additional words in the page 208 are written, the key number is incremented as shown, so that the thirty-second word (labeled 204) is scrambled using Key31. The next word written (labeled 206) is scrambled using Key0, as the 32-keys are reused for each subsequent group of 32 words in the page. Since the purpose of the Scrambler is to avoid fixed patterns rather than to encrypt the data, re-using the keys after 128 bytes is sufficient "randomness" to break up memory cell states across a word line (i.e., from bit line to bit line). However, other randomization techniques may be employed, as noted below, that may be even more "random."

To break up memory cell states going down the bit-lines, each page starts using a different key. The first 32-bit word (labeled 210) of the next memory page 216 is scrambled using Key1. As additional words in the page 216 are written (or read), the key number is incremented, as before, so that the thirty-first word (labeled 212) is scrambled using Key31, and the thirty-second word (labeled 214) is scrambled using Key0. The subsequent word 215 scrambled using Key1 since, as before, the 32 different keys are reused for each subsequent group of 32 words in the page.

The identification of the first key to be used for each page may be provided by a Starting Key Number (SKN), which acts as an index or offset from a fixed reference point (i.e., Key0 or the Seed). The index is changed on every logical page transition to create a staggered bit pattern produced from the bit strings of the rotating Keys. Such a logical page address transition occurs when transitioning from one word line to the next word line, and may also occur within a single word line (e.g., in an MLC cell having an upper page and a lower page stored in the memory cells of a given word line, and also if a word line has more memory cells than the number of bits in a page). The ability to offset the starting Key results in a bit-map-like pattern of walking 0's and 1's that when XOR'ed with the data, produces a striping effect across the memory cell array. Thus, the Scrambler Keys serve the purpose of toggling bits. The rotation of the Keys serves to shift the bit patterns across the word lines (and across different pages). The Starting Key Number serves the purpose of shifting the bit patterns going down the bit-lines, while setting the correct Key according to the appropriate page.

Rotating keys along word lines and from word line to word line as described above may avoid certain problematic patterns of data in two dimensional memory arrays. However, in some three-dimensional (3-D) memory arrays, additional problematic patterns may occur that may not be addressed with the scrambling described above.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending up from the wafer surface. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088.

Figure 9:
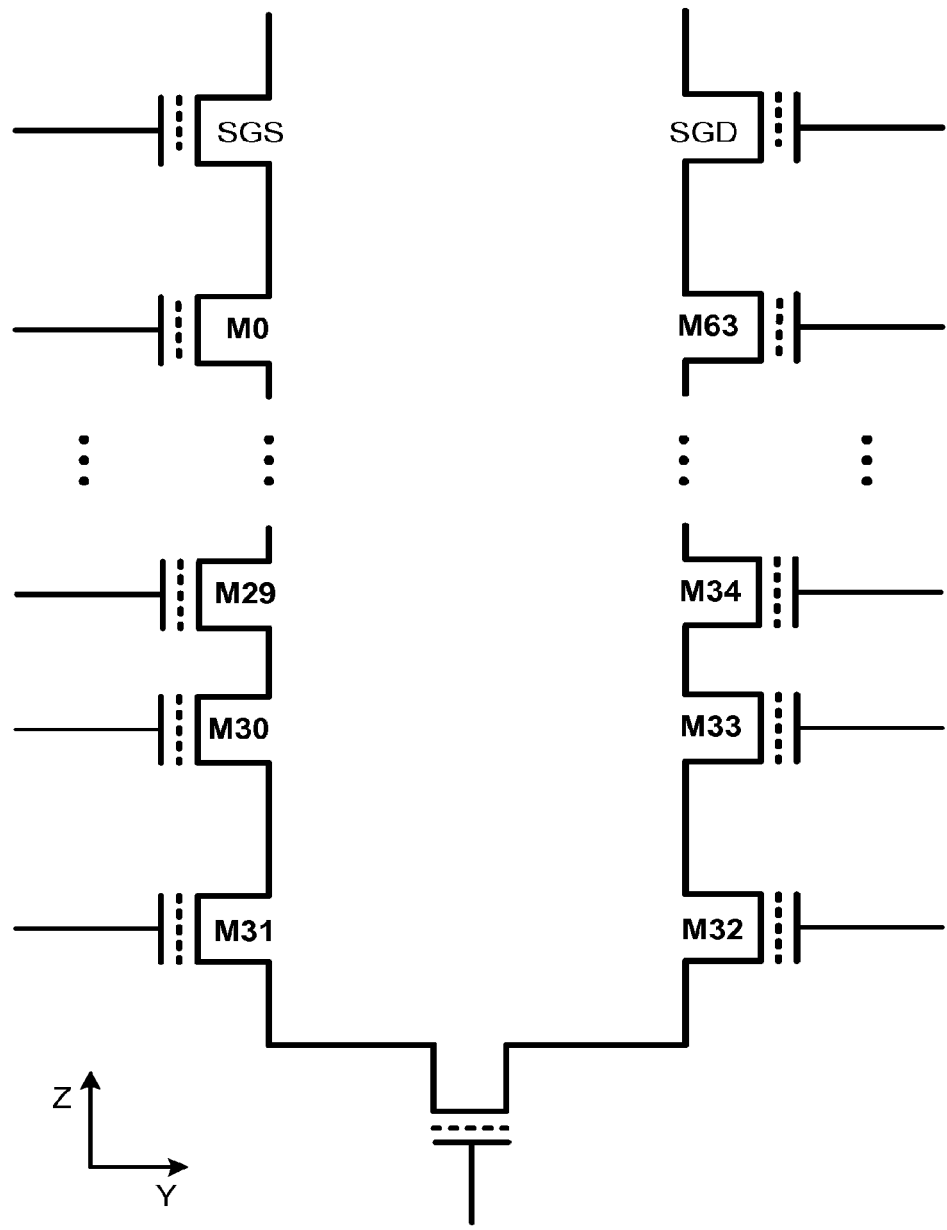
FIG. 9 is a schematic of an example of a 3-D NAND string.

FIG. 9 is a schematic showing an example of one such arrangement in which memory cells M0-M63 are formed along two sides of a U-shaped NAND string. (Not all 64 memory cells are shown for clarity of illustration, dashed lines indicate omitted memory cells.) Memory cells M0-M31 are formed on one side (left side of FIG. 9) with memory cells M32-M63 formed on the other side (right side of FIG. 9). Separate control gates are formed in each memory cell in a string where a word line couples to the cell's channel. Word lines extend horizontally to connect control gates of memory cells of other strings in the same row. Source and drain select transistors are provided at either end of the string to allow the string to be selectively connected to external connections for reading, writing, and erasing. At the bottom of the U-shaped string the two sides are connected. This connection may be formed by a controllable transistor, or gate, as shown in FIG. 9 so that one side of the string can be isolated from the other. In some cases, one or more memory cells may be considered as dummy cells that do not store data because they are unreliable. For example, memory cells immediately adjacent to select transistors may be unreliable because of their location and may be dummy cells. Thus, rows of dummy cells may be formed, connected by dummy word lines.

Figure 10:
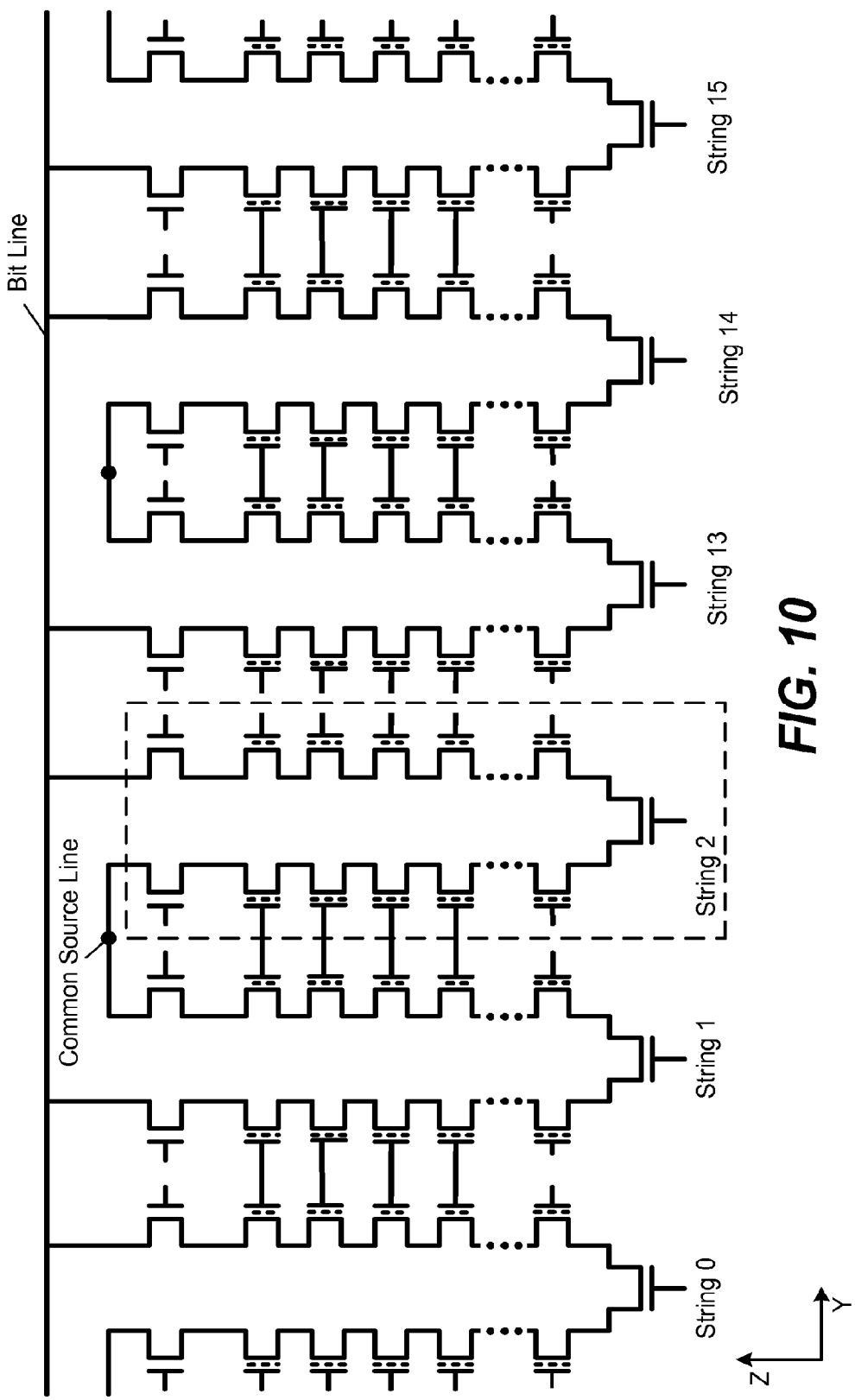
FIG. 10 is a schematic of a portion of an example of a 3-D NAND array.

FIG. 10 is a schematic that shows the string of FIG. 9 (outlined by dashed lines) connected as string 2 of 16 strings that are connected to a common bit line in a block of a 3-D memory array. One end of string 2 (the right end in FIG. 10) is connected to the bit line, while the other end of string 2 (the left end in FIG. 10) is connected to a common source line. The bit line extends in the y-direction as shown in FIG. 10 and connects the drains of strings 0-15 along the y-direction. (The x, y, and z axes follow the conventional scheme where the z axis is perpendicular to the surface of the substrate). The common source line extends in the direction perpendicular to the plane of FIG. 10 (i.e. it extends in the x-direction) and connects to other similar strings that are connected to other bit lines. Strings are arranged in an alternating pattern with source sides of neighboring strings adjacent each other and drain sides of neighboring strings adjacent to each other in the y-direction (i.e. drain to the left in string 1, then drain to the right in string 2, then drain to the left in string 3, etc.). This allows adjacent strings to share common source lines and share word lines.

Word lines extend in the x-direction. Word lines are shared between adjacent strings as shown, and may be connected so that word lines of different strings within a block are connected together (further described below). Select lines also extend in the x-direction but are not shared. They are separate so that they can be separately biased to individually select rows of strings. It will be understood that the strings 0-16 represented in FIG. 10 form just a small portion of the overall memory array, with many more such strings along the bit line (i.e. on either side of the portion shown), and with many more bit lines.

Figure 11A:
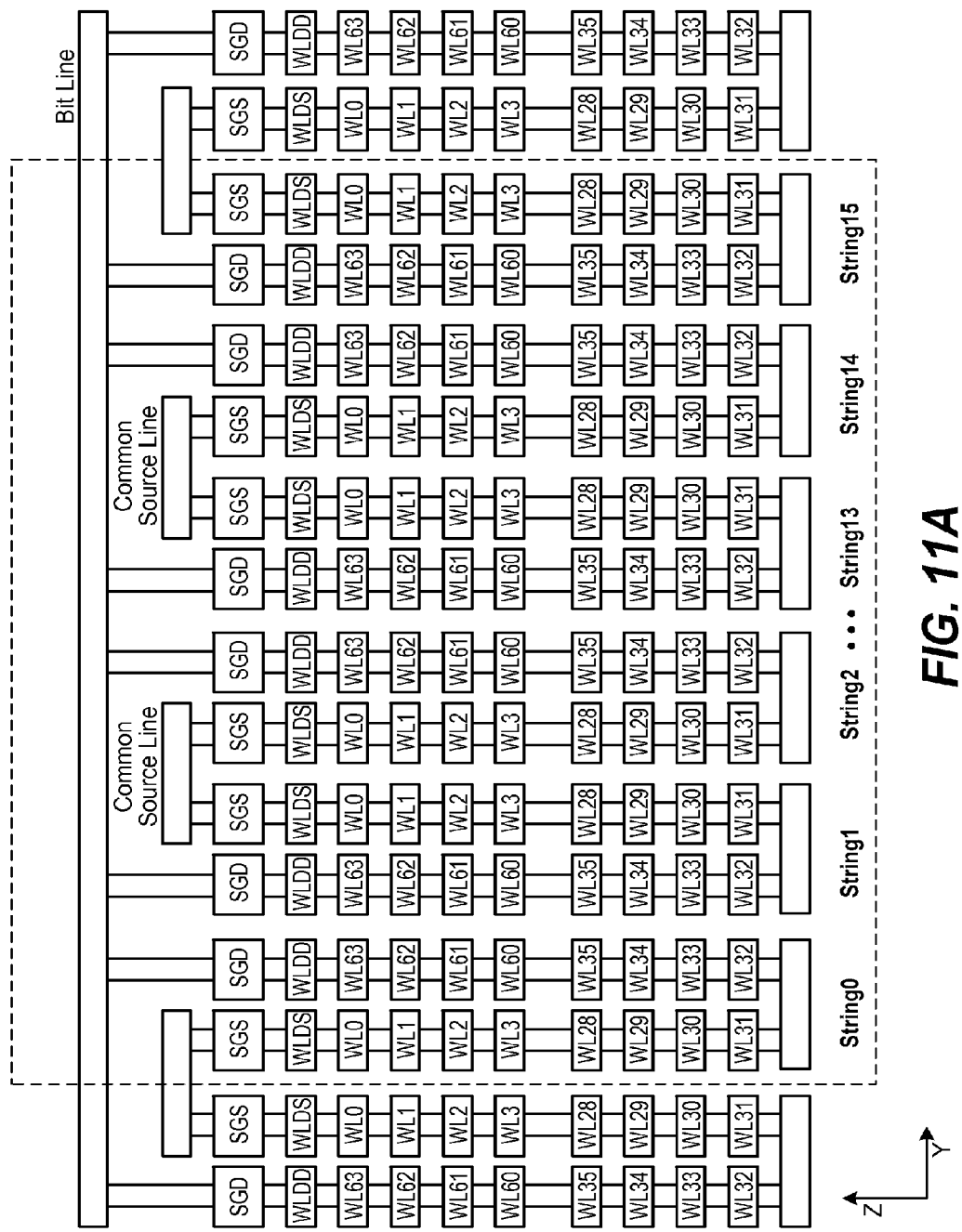
FIG. 11A is a cross-section of a portion of an example of a 3-D NAND array.

FIG. 11A shows a physical implementation of the circuit illustrated in FIG. 10. The bit line extends as a continuous conductor (e.g. metal line) in the y-direction with vertical connections formed between the bit line and drains of strings. Below the bit line, common source lines extend perpendicular to the cross section shown (i.e. extend in the x-direction) and connect sources of neighboring strings. Source select lines extend in the x-direction and form source select gates (SGS) where they intersect vertical columns. Drain select lines extend in the x-direction and form drain select gates (SGD) where they intersect vertical columns. Word lines WL0-WL63 extend in the x-direction and form control gates of memory cells where they intersect vertical columns. In one example, word lines are formed from conductive layers separated by dielectric layers, with channels of memory cells being formed in vertical holes ("memory holes") that extend through the conductive layers and dielectric layers.

The structure of the 3-D memory array of FIG. 11A is comprised of multiple layers, with each layer having the same replicated pattern (e.g. layer in dashed lines containing WL34 and WL29 is replicated at each level). Taking word line 34 as a typical word line, it can be seen that word line 34 alternates with word line 29 along the y-direction. While word lines of each string may be separately controlled in some memory systems, combining word lines saves space for driver circuits. In the present example, all word lines of the same number within a block are formed from a single portion of conductive material and together form an electrically continuous unit. For example, all word lines marked WL34 are formed of a single electrically-conductive portion of material, and all word lines marked WL29 are formed of another electrically-conductive portion of material (which may initially be formed from the same layer).

Figure 11B:
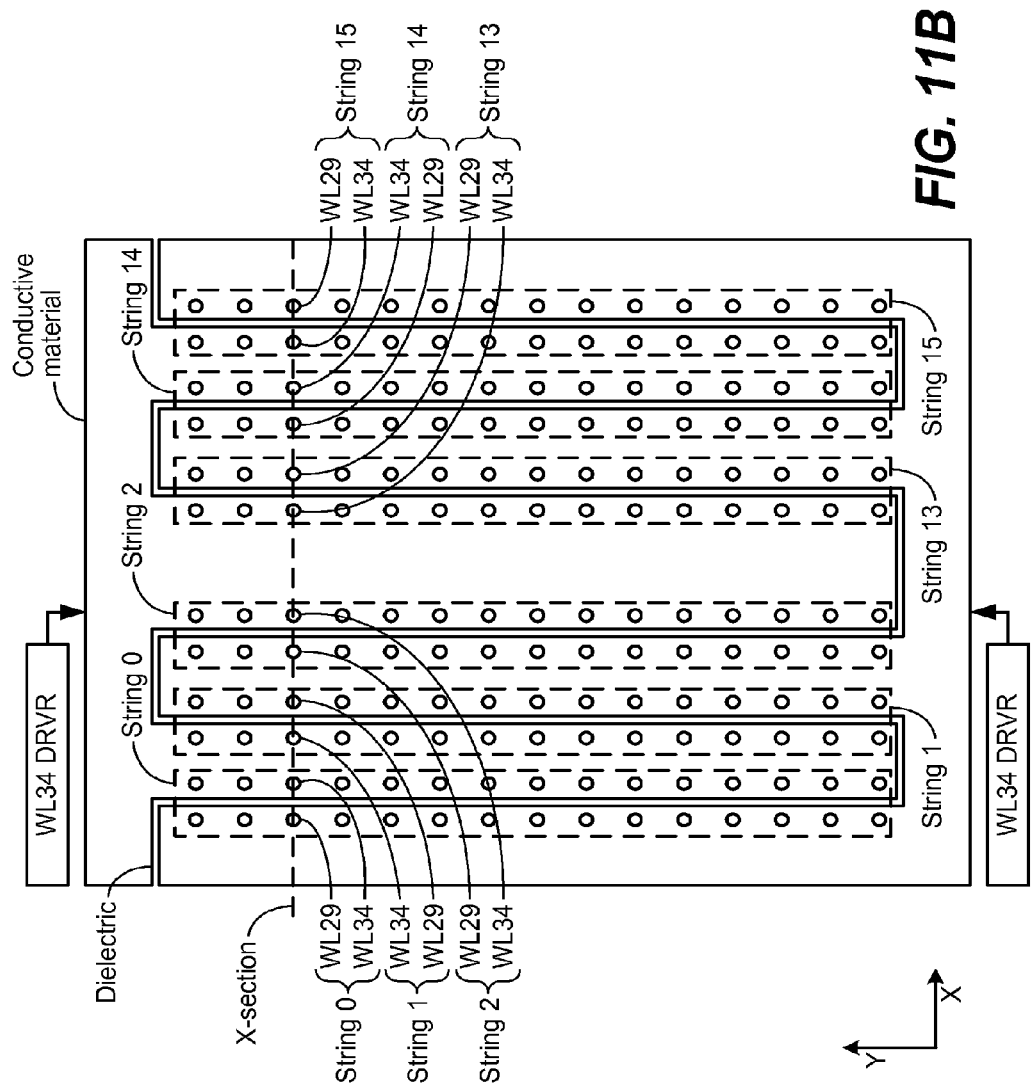
FIG. 11B is another cross-section of a portion of an example of a 3-D NAND array.

FIG. 11B shows a top-down view of the structure of word lines 34 and 29 with the horizontal dashed line showing the location of the cross section of FIG. 11A. It can be seen that a portion of conductive material extends along the top in this view with extensions extending down (negative y-direction). These extensions form pairs of word lines shown in FIG. 11A (WL34) with memory cells formed where memory holes containing channels pass through the word lines. A driver circuit "WL34 DRVR" is connected to this portion of conductive material so that a controllable voltage can be applied to it and thus to control gates of all memory cells connected to any WL34 in this block. A similar portion of conductive material extends along the bottom in this view with extensions extending up (positive y-direction). These extensions form pairs of word lines shown in FIG. 11A (WL29) with memory cells formed where memory holes pass through the word lines. A driver circuit "WL29 DRVR" is connected to this portion of material so that a controllable voltage can be applied to it and thus to control gates of all memory cells connected to any word line 29 in this block. These two portions of material may be formed by depositing a single layer of conductive material and patterning it into the portions shown (and similar portions for other blocks). A dielectric material may be used to fill the gap between portions. For example, a Shallow Trench Isolation (STI) process may be used to physically separate, and electrically isolate, the two portions. Dielectric layers above and below these portions (in the z-direction) insulate these portions from other similar layers. This pattern may be replicated for each pair of word lines in the block so that for 64 word lines, there are 32 layers similar to that shown in FIG. 11B, with dielectric layers in between.

3-D NAND Randomization

Accessing a 3-D memory array like that described above is different to accessing a 2-D array because in any given block there are multiple strings connected to the same bit line. Thus, to access particular data, it is necessary to select not only the word line and bit line(s), but also to select a string. One consequence of 3-D geometry is that certain data patterns may occur in 3-D memory that do not occur in 2-D memory and some of these patterns may be problematic and may make data more prone to disturbance.

For any given word line and bit line, there are multiple strings in a given block. Thus, when using a randomization scheme as described above that randomizes along a word line, and from word line to word line along the bit line direction, there may not be randomization from string to string of a given word line or from word line to word line within a given string. Such schemes have a limited number of keys that are repeated with a certain frequency. If the repetitive pattern of randomization aligns with the physical array of memory cells, then keys may align in at least one dimension and thus obviate the benefits of randomization (i.e. applying the same key to neighboring cells may not break up patterns that might be broken up by applying different keys). For example, in FIGS. 11A and 11B, word line 34 may have the same keys applied in each string (i.e. same keys in string 0, string 1, string 2 . . . up to string 15). Such a repeated key pattern makes it more likely that cells of different strings of a given word line will be programmed to the same state (e.g. string 0, string 1 . . . string 15 of a given word line all similarly programmed). This may lead to disturbance.

For example, to program data along WL34 in a given string, WL34 DRVR applies a program voltage, Vpgm, to WL34 (e.g. as a series of pulses) and a pass voltage is applied to all other word lines (WL0-WL33, and WL35-WL63) in all strings of the block. String 15 of WL34 may be unselected throughout programming of strings 0-14 of WL 34 but because WL34 is common to all strings of the block, WL34 in string 15 has a program voltage applied for significant periods of time while programming strings 0-14 to high threshold voltages. It is generally desirable to randomize data from string to string of a given word line to avoid such disturbance (i.e. if strings 0-14 are programmed to various randomized threshold voltages then disturbance is less likely than if they are all programmed to a high threshold voltage). Randomization schemes that are suitable for 2-D randomization may not adequately randomize data to avoid such problematic patterns in 3-D memory.

According to an aspect of the present invention, data to be stored in a 3-D memory array is randomized so that the data is not only randomized along a word line, and from word line to word line, but is additionally randomized from string to string of a given word line. When a repetitive pattern in key assignment would assign identical keys to strings of a particular word line an additional randomization factor is used to prevent such identical keys being assigned. Such randomization may be performed either by a memory controller, by a host, by circuits on the same die as the memory array, or by any other suitable circuit. Such randomization may be combined with other operations such as ECC, or may be independently performed. Multiple randomization operations may be separately performed on the same data (e.g. in a memory controller and additionally in a memory die).

An example of a randomization scheme in the '912 patent is given by the following formula for recursively calculating Starting Key Number (SKN):

$K_n$=seed rotated left by $SKN_n$ $SKN_{n+1}=[SKN_n+C+P+(SKN_n+P)]>>5$

Where:
C=DWord Offset & 0x1f
P=Page Offset Number & 0x1f
$SKN_0=P$

The Page Offset Number, the D-word offset number, and the Byte Offset Number are calculated using the formulas shown above. The ">>" operator is a right non-circular shift function, resulting here in a "divide by 32 without remainder" function. The "&" operator is a bit-wise AND operator. This formula may be modified to account for different strings in the same word line to obtain the following formula:

$SKN_{n+1}=[SKN_n+C+P+S+(SKN_n+P)]>>5$

Where:
C=DWord Offset & 0x1f
P=Page Offset Number & 0x1f
S=String Offset & 0x1f
$SKN_0=P$ Thus, by adding the additional term "S" to the equation to account for different strings of the same word line, the randomization scheme is better adapted for a 3-D array.

In another example, a randomization scheme may be modified to account for different strings by changing the scrambler formula from mod(page,32) to mod(page,31) which drops one key. FIG. 12 shows an example of a repeated pattern of randomly arranged keys as applied to MLC memory cells (2-bit per cell) along word lines. While keys are arranged in a random pattern, the pattern repeats every 16 word lines (32 keys, with two keys per word line, one for upper page and one for lower page). Thus, depending on the order in which data is programmed, various alignments of such keys are possible. (While only 32 word lines are shown it will be understood that this pattern continues to repeat every 16 word lines over any number of word lines).

FIG. 13 shows an example of how the randomized keys of FIG. 12 may be assigned in a different manner that does not align with the physical geometry of a 3-D memory array. Instead of repeating the 32-key pattern of FIG. 12 in each iteration, the last key of the pattern is dropped each time so that 31 of 32 keys are used in a given iteration. In FIG. 13, the upper page of WL15 uses key 7, which is the first key of a new iteration, rather than key 31, the last key of the old iteration (as in FIG. 12). Repeating a pattern of 31 keys breaks up alignment between keys and physical structures of the 3-D memory array. It will be understood that this approach is not limited to any particular number of keys, or number of dropped keys, and that examples may have more, or fewer, than 32 keys and may drop more than one key.

In another example, the scrambler scheme may be modified to mod(page+page/32,32) so that 32 keys are used in each iteration but the start key is offset to create misalignment from one iteration to the next. FIG. 14 shows an example of two iterations where the second iteration is modified from the first iteration so that instead of starting with key 7 as before, it begins with key 6 (which was the second key in the first iteration). The sequence of keys from key 6 onwards is the same as in the first iteration until the next to last key (key 31). Then, key 7 is used as the last key. This approach may be represented by modifying the SKN formula above as follows, and rounding down when the result is not an integer:

$$SKN_{n+1}=[SKN_n+C+P+(SKN_n+P)]>>5$$

Where:
C=DWord Offset & 0x1f
P=(Page Offset Number+Page Offset Number/32)& 0x1e
$SKN_0$=P In another example, data may be randomized according to a pattern of keys such as shown in FIG. 12. However, instead of randomizing the data in the order shown, some of the data may be randomized and stored in reverse of the column order indicated. For example, FIG. 15A shows eight randomization keys 0-7 that are applied in sequential columnar order along WL0, WL2, and WL4, and are applied in reverse columnar order along WL1, and WL3. Thus, randomization keys are not the same for immediately adjacent word lines.

In another example, data may be reordered, in reverse column order, prior to scrambling while randomization keys are applied in a fixed manner (without reversing randomization key order from word line to word line). An example of such reordering of data is shown in FIG. 15B which shows data along even numbered word lines (WL0, WL2, WL4) written from left-to-right, while data along odd numbered word lines (WL1, WL3) is written from right-to-left. In some cases both data and randomization keys may be reversed from word line to word line.

In another example, keys may be inverted so that the number of available keys is doubled. FIG. 16 shows examples of keys and inverted keys in hexadecimal notation (an individual key consists of four entries, each of which is a two-digit hexadecimal number so that a key is a four-byte number). For example, the first byte of key 1 is C7, which is inverted to 38 in inverted key /1. Inverted and uninverted keys may be used alternately or in some other arrangement so that the overall randomization is increased.

In another example, data may be inverted in some cases in order to break up patterns in the data. For example, alternate word lines may contain inverted data. Such data inversion may be performed prior to randomization or after randomization. Data inversion may be instead of, or in addition to inversion of keys.

In some examples, data randomization is performed by an ECC block in a memory controller or ASIC, additional randomization may be performed in a memory die in order to add randomization and to avoid patterns of data that could cause disturbance. In general, randomization may be performed either on the same chip as the memory cells (e.g. using on-chip randomization circuits on a NAND memory chip), or off-chip in an ASIC, memory controller, or other chip. Where multiple randomization circuits are available (e.g. both on a memory chip and on an ASIC) then such circuits may be used alternately to randomize different data using different randomization routines so that additional randomization is achieved. Alternatively, two different randomization schemes may be performed in series, one in an ASIC and another in a memory chip.

While several different randomization schemes are described individually above it will be understood that such schemes may be applied individually or in some combination according to requirements and according to particular memory array designs. Different data may be subject to different randomization schemes according to the nature of the data or the location where the data is to be stored. Randomization schemes described here may be combined with one or more other randomization schemes as part of an overall randomization scheme. While particular hardware examples are described these are for illustration and aspects of the present invention may be applied to a wide variety of hardware designs.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A three-dimensional charge-storage memory formed in a plurality of physical levels disposed above a substrate, comprising:
   a plurality of strings of memory cells, memory cells of an individual string connected in series in the vertical direction; and a randomization circuit that randomizes portions of data, prior to storage in the plurality of strings of memory cells, using a plurality of randomization keys, such that portions of data that are to be stored at locations immediately adjacent to each other in the vertical direction are randomized using different randomization keys and portions of data that are to be stored at locations immediately adjacent to each other in the horizontal direction are randomized using different randomization keys.

2. The three-dimensional charge-storage memory of claim 1 wherein the randomization circuit uses the plurality of randomization keys according to a sequence.

3. The three-dimensional charge-storage memory of claim 2 wherein the randomization circuit omits one or more of the plurality of randomization keys in an iteration of the sequence.

4. The three-dimensional charge-storage memory of claim 2 wherein the randomization circuit applies a variable offset within the sequence to determine a first randomization key of an iteration of the sequence.

5. The three-dimensional charge-storage memory of claim 1 wherein the randomization circuit is on a first chip and the plurality of strings of memory cells are on a second chip.

6. The three-dimensional charge-storage memory of claim 5 further comprising an on-chip scrambler circuit on the second chip.

7. The three-dimensional charge-storage memory of claim 6 wherein some data to be stored in the plurality of strings of memory cells is randomized using the randomization circuit on the first chip and some of the data to be stored in the plurality of strings of memory cells is randomized using the on-chip scrambler circuit on the second chip.

8. The three-dimensional charge-storage memory of claim 6 wherein data to be stored in the plurality of strings of memory cells is randomized using the randomization circuit on the first chip and is additionally randomized using the on-chip scrambler circuit on the second chip.

9. A three-dimensional charge-storage memory formed in a plurality of physical levels disposed above a substrate, comprising:
a plurality of strings of memory cells, memory cells of an individual string connected in series in the vertical direction; and
a randomization circuit that randomizes portions of data prior to storage in the plurality of strings of memory cells, using a plurality of randomization keys in a rotating sequence that is modified from iteration to iteration by at least one of: selecting different seed keys; selecting different directions for proceeding through the rotating sequence; inverting selected keys; or inverting selected portions of data.

10. A method of operating a three-dimensional charge-storage memory that stores data in memory cells formed in multiple physical levels disposed above a substrate, comprising:
receiving a plurality of portions of data to be stored in the three-dimensional charge-storage memory;
determining physical locations in the three-dimensional charge-storage memory array for storing the plurality of portions of data; and
randomizing the plurality of portions of data according to their respective physical locations using a plurality of randomization keys such that portions of data that are to be stored at locations immediately adjacent to each other in the vertical direction are randomized using different randomization keys and portions of data that are to be stored at locations immediately adjacent to each other in the horizontal direction are randomized using different randomization keys.

11. The method of claim 1 wherein the plurality of randomization keys are used in a sequence, with fewer than all available randomization keys used in an iteration of the sequence.

12. The method of claim 1 wherein the plurality of randomization keys are used in a sequence, with iterations of the sequence starting with different randomization keys.

13. The method of claim 1 further comprising inverting selected portions of the plurality of portions of data.

14. The method of claim 1 further comprising inverting selected randomization keys of the plurality of randomization keys prior to performing randomization.

15. The method of claim 1 wherein the vertically-stacked memory cells form U-shaped strings with corresponding word lines of different strings of a block connected together, further comprising randomizing data along an individual word line using randomization that is different to randomization used for any corresponding word line connected to the individual word line.

16. The method of claim 1 wherein the physical locations in the three-dimensional charge-storage memory for storing the plurality of portions are along commonly connected word lines in a block and data along an individual word line is randomized using a randomization key that is different to any randomization key used on word lines connected with the individual word line.

17. The method of claim 16 wherein portions of data to be stored along commonly connected word lines are randomized by applying randomization keys according to a predetermined sequence.

18. The method of claim 17 wherein randomization is modified by omitting one or more randomization keys from the predetermined sequence in different iterations.

19. The method of claim 17 wherein randomization is modified by applying an offset within the predetermined sequence so that different starting randomization keys are used in different iterations.

20. The method of claim 16 wherein at least some different randomization keys are generated by inverting other randomization keys.

21. A method of operating a three-dimensional charge-storage memory that stores data in memory cells formed in multiple physical levels disposed above a substrate, comprising:
receiving a plurality of portions of data to be stored in the three-dimensional charge-storage memory;
determining physical locations in the three-dimensional charge-storage memory for storing the plurality of portions of data; and
randomizing the plurality of portions of data according to their respective physical locations using a plurality of randomization keys in a rotating sequence that is modified from iteration to iteration by at least one of: selecting different seed keys; selecting different directions for proceeding through the rotating sequence; inverting selected keys; or inverting selected portions of data.

* * * * *